United States Patent [19]
Foster et al.

[11] Patent Number: 5,504,652
[45] Date of Patent: Apr. 2, 1996

[54] UNITARY HEAT SINK FOR INTEGRATED CIRCUITS

[75] Inventors: Alan D. Foster, Los Altos; Mark P. August, Los Gatos, both of Calif.

[73] Assignee: Apple Computer, Inc., Cupertino, Calif.

[21] Appl. No.: 307,516

[22] Filed: Sep. 16, 1994

[51] Int. Cl.$^6$ ........................................................ H05H 7/20
[52] U.S. Cl. ........................... 361/704; 257/712; 257/719; 361/718
[58] Field of Search ................................... 165/80.2, 80.3, 165/185; 174/16.3; 257/707, 712–713, 718–719, 726–727; 361/704, 707, 710–712, 717–719, 722

[56] References Cited

U.S. PATENT DOCUMENTS

| | | | |
|---|---|---|---|
| 4,597,617 | 7/1986 | Enochs | 339/17 |
| 4,812,949 | 3/1989 | Fontan et al. | 361/386 |
| 4,842,662 | 6/1989 | Jacobi | 156/633 |
| 4,849,856 | 7/1989 | Funari et al. | 174/16.3 |
| 4,887,147 | 12/1989 | Friedman | 357/74 |
| 4,890,194 | 12/1989 | Derryberry et al. | 361/386 |
| 4,914,551 | 4/1990 | Anschel et al. | 361/389 |
| 5,053,922 | 10/1991 | Matta et al. | 361/386 |
| 5,206,792 | 4/1993 | Reynolds | 361/719 |

OTHER PUBLICATIONS

Johson, IBM Tech. Dis. Bulletin, "Integrated Circuit Semiconductor Device Package Structure", vol. 19, No. 9, Feb. 1977, pp. 3387–3388.

"TO–3 Heat Sinks." (date unknown).

Deeney, Jeffrey L., et al. "TAB As a High Leadcount PGA Replacement," 1991 IEEE.

Corman, Ned et al., "Heat Sinking Ceramic Leadless Chip Carriers," AMP Technical Paper, AMP Incorporated 1984.

*Primary Examiner*—Gregory D. Thompson
*Attorney, Agent, or Firm*—Hickman & Beyer

[57] ABSTRACT

A unitary heat sink including a planar contact portion for contacting the top of an IC. The heat sink is constructed from a material having a thermal conductivity of at least 150 watts per meter Degree Kelvin (W/m°K.) but preferably is constructed from aluminum having a conductivity of 221 (W/m°K.). A number of leg portions extend from the contact portion such that each leg portion has a distal end. The leg portions, being made of the same material as the contact portion, are configured to have a sufficient resiliency such that deformations of the leg portions provide a spring force in the range of 5 to 16 lbs against the top of the IC. A method for dissipating heat from an integrated circuit includes the steps of forming a unitary heat sink from a heat sink material, where the heat sink includes a contact portion and a number of integral, spring leg portions. The method continues with the attachment of an integrated circuit to a printed circuit board, and the attachment of the leg portions of the heat sink to the printed circuit board such that the contact portion of the heat sink is urged towards the heat transfer surface of the integrated circuit with a spring force in the range of 5 to 16 lbs.

34 Claims, 6 Drawing Sheets

UNITARY HEAT SINK FOR INTEGRATED CIRCUITS

FIELD OF THE INVENTION

This invention relates generally to heat sinks for semiconductor devices and, more particularly, to heat sinks for integrated circuits.

BACKGROUND OF THE TECHNICAL ART

Integrated circuits are becoming increasingly powerful and complex. Greater complexity implies greater circuit density and faster circuit operation which, in general, increases the problems of heat generation due to the operation of the integrated circuit (IC). If heat is not properly dissipated from an integrated circuit, it may, over time, malfunction or fail.

One of the most common and effective methods of dissipating heat generated by an integrated circuit is by use of a "heat sink", which includes a thermally conductive material which conducts heat away from the integrated circuit and then dissipates the heat into the ambient environment. The heat sink is placed in thermal contact with either the package of an integrated circuit (for packaged integrated circuits) or with the integrated circuit die itself (for unpackaged integrated circuits) to moderate the temperature of the IC.

There are two major categories of heat sinks. A first category includes heat sinks that attach directly to an integrated circuit, either with clips, other fasteners, or by means of an appropriate adhesive. This type of heat sink tends to be somewhat unreliable since it can become dislodged from the integrated circuits by, for example, an inadvertent lateral force exerted on the heat sink or due to thermal cycling of the IC. Also, these types of heat sinks do not protect packageless ICs from lateral forces, i.e. forces in an x-y plane parallel to the IC. This is a problem because packageless ICs are quite fragile, and their interconnections to a printed circuit board, interposer, or the like are easily damaged by lateral forces.

A second category of heat sinks includes heat sinks that are attached directly to the printed circuit PC boards which support the ICs. These types of heat sinks tend to be more reliable than the first category of heat sinks because they can be firmly attached to the PC board and because they better protect the ICs that they are cooling. However, they tend to be more expensive to manufacture and install than the first category of heat sinks. They also have the problem of applying a correct amount of force to the upper surface of an integrated circuit to ensure good thermal conduction but without damage to the IC.

This problem of applying the correct amount of force to an IC with this second category of heat sinks is particularly important to address with the "packageless" integrated circuits being increasingly used in industry. While packageless ICs tend to be of high performance and lower cost than traditional packaged ICs, they are more fragile due to their lack of a protective housing. Examples of technologies which utilize packageless integrated circuits include Tape Automated Bonding (TAB), Direct Chip Attach (DCA), and some Ball Grid Array (BGA) technologies.

The prior art has addressed this problem in two basic ways. One solution is to make a heat sink with resilient spring members which ensure that a proper amount of pressure is applied to the IC by the heat sink. These heat sinks, however, have multiple parts (including a number of small leaf springs) which add to the cost and reduce the reliability of the heat sinks. Another solution is to produce unitary heat sinks with "standoffs" which ensure that the proper amount of pressure is applied to the IC by the heat sink after the heat sink is attached to the PC board.

Prior art unitary heat sink designs are typically manufactured by first rough-forming a heat sink body (such as by molding, extrusion, etc.) and then by machining (such as with a rotary mill) the heat sink body to form the appropriate standoffs. A standoff is a mass of material which ensures that the portion of the heat sink that is in contact with the integrated circuit is at about the right distance from the printed circuit board supporting the integrated circuit, i.e. it is has a height that is about the same as the distance from the top of the integrated circuit package to the surface of the printed circuit board. Due to the large number of manufacturing steps, these unitary heat sinks of the prior art tend to be quite expensive.

Furthermore, the distance from the top of the chip package to the circuit board tends to vary from IC to IC due to differences in die or package sizes, the amount of glue or solder used to attach the die to the printed circuit board, and other factors. Therefore, unitary heat sinks of the prior art that rely on standoffs must be manufactured for each different integrated circuit size and mounting technology. This reduces economies of scale in the production of the heat sinks, and increases inventory costs.

SUMMARY OF THE INVENTION

The present invention is a unitary heat sink as particularly well adopted for use with packageless integrated circuits such as TAB, DCA, and BGA mounted packageless integrated circuits. The heat sink of the present design can be conveniently stamped and formed at a relatively low cost, it includes resilient leg structures which permit the heat sink to exert the proper amount of pressure to the upper surface of an integrated circuit.

A unitary heat sink of the present invention includes a contact portion defining a heat sink plane. The heat sink is constructed from a material having a thermal conductivity of at least 150 W/m° K., and has a number of leg portions formed contiguously with and cantilevered from the contact portion of the heat sink. The leg portions have sufficient resiliency such that deformation of the leg portions from the heat sink plane can provide a spring force in the range of 5 to 16 lbs relative to the heat sink plane. Preferably, the heat sink is made from aluminum and has a thermal conductivity of at least 221 W/m° K. The heat sink also preferably includes a heat dissipation portion formed contiguously with the contact portion. In most of its disclosed embodiment of the present invention, the dissipation portion includes four fins provided with a number of convection apertures.

The unitary heat sink of the present invention is preferably a component of an electronic apparatus including a printed circuit board have one or more integrated circuits. An integrated circuit typically has a substantially planar top surface which is a convenient surface for the transfer of heat to the ambient environment. The unitary heat sink is positioned over the heat transfer surface of the integrated circuit such that a contact portion of the heat sink is thermally coupled to the IC. A number of legs (preferably four) are formed contiguously with the contact portion of the unitary heat sink and are cantilevered from the contact portion such that each leg portion has a distal end that can be attached to the printed circuit board by means of a fastener. After the legs are attached to the PC board, they provide a spring force against the heat transfer surface of the integrated circuit to ensure good heat transfer characteristics. The unitary heat sink is braced from moving in an x-y plane by the/bur legs and therefore protects the integrated circuit from transverse forces. The spring legs are designed such that the IC is not damaged by compressive spring forces from the z direction.

A method of dissipating heat from an integrated circuit in accordance with the present invention includes the steps of forming a unitary heat sink, attaching an integrated circuit to a printed circuit board, and attaching leg portions of heat sink to the printed circuit board such that a contact portion of the heat sink is thermally coupled to a heat transfer surface of the integrated circuit and preferably exerts a spring force in the range of 5 to 16 lbs. The method can include an additional step of providing a thermal transfer material, such as a thermal grease, between the contact portion of the heat sink and the heat transfer surface of the integrated circuit. Preferably, the heat sink is inhibited from movement along an x-y plane defined by the heat transfer surface but is compliant in a z direction perpendicular to the x-y plane.

These and other advantages of the present invention will become apparent upon reading the following detailed descriptions and studying the various figures of the drawings.

BRIEF DESCRIPTION OF THE DRAWINGS

FIG. 2b is a side elevational view of a TAB mounted packageless IC attached to a PC board and aligned with the unitary heat sink depicted in FIG. 2a;

FIG. 3 is a top plan view taken along line 3—3 of FIG. 2a;

FIG. 4 is a bottom plan view taken along line 4—4 of FIG. 2a;

FIG. 6a is a detail view of the portion of FIG. 3 encircled by the line 6a;

FIG. 6b is a side elevational view taken along line 6b—6b of FIG. 6a;

FIG. 8b is a side elevational view of a TAB mounted packageless IC attached to a PC board and aligned with the unitary heat sink depicted in FIG. 8a;

DETAILED DESCRIPTION OF THE PREFERRED EMBODIMENTS

Figure 1:
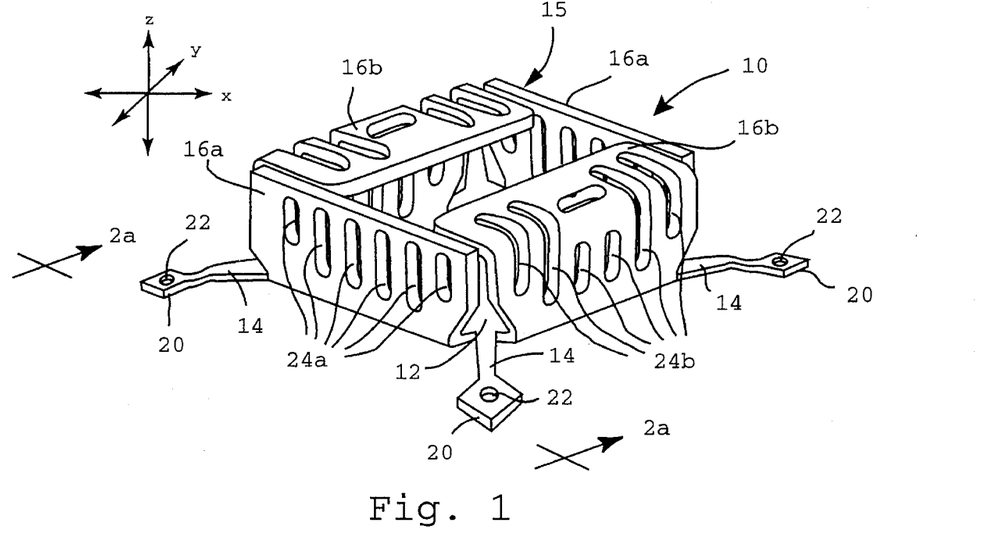
FIG. 1 is a perspective view of a unitary heat sink in accordance with the present invention.

In FIG. 1, a unitary heat sink 10 in accordance with the present invention includes a contact portion 12 and a number of leg portions 14 formed contiguously with and cantilevered from the contact portion. The heat sink 10 also includes a heat dissipation portion 15 including a number of fins 16a and 16b.

The heat sink 10 is of unitary design such that the contact portion 12, legs 14, and heat dissipation portion 15 are made from a single, contiguous piece of material. In the present invention, this material is preferably an aluminum alloy which is sold under American National Standards Institute (ANSI) 1100-H14. This aluminum alloy material has good thermal conductivity, resiliency, and workability. As will be discussed in greater detail subsequently, the unitary heat sink 10 is preferably made by stamping heat sink 10 from the aluminum material in a press, and then subsequently folding the heat sink to provide fins or other features at progressive stages within the press.

The material of the heat sink 10 preferably has a thermal conductivity of at least 150 Watts per meter per degree Kelvin (W/m°K.). As a measure of "thermal conductivity," the higher the number, the greater thermal conductivity of the material. In general, it is desirable to have a heat sink with high thermal conductivity so that heat is efficiently conducted away from the integrated circuit to be dissipated into the ambient environment. By "ambient environment" it is meant the environment surrounding the integrated circuit, which may be attached to a printed circuit board and enclosed with a box or chassis. Often, forced air by means of a fan or the like is provided within the ambient environment to enhance the heat dissipation capacity of the heat sink 10 due to well-known convection principles.

The heat sink material of this preferred embodiment is the aforementioned ANSI 1100-H14 aluminum alloy. This aluminum alloy has a thermal conductivity of approximately 221 W/m°K. However, alternate embodiments of the present invention can be made from materials other than the aforementioned aluminum alloy, such as pure aluminum, other aluminum alloys, copper, and copper alloys such as brass or bronze. While silver has a very high thermal conductivity, it is generally considered to be too expensive for use as a heat sink material. However, a heat sink made from a copper alloy may be a good candidate in that thermal conductivity of about 385 (W/m° K) may be achieved at a relatively reasonable cost.

Figure 2A:
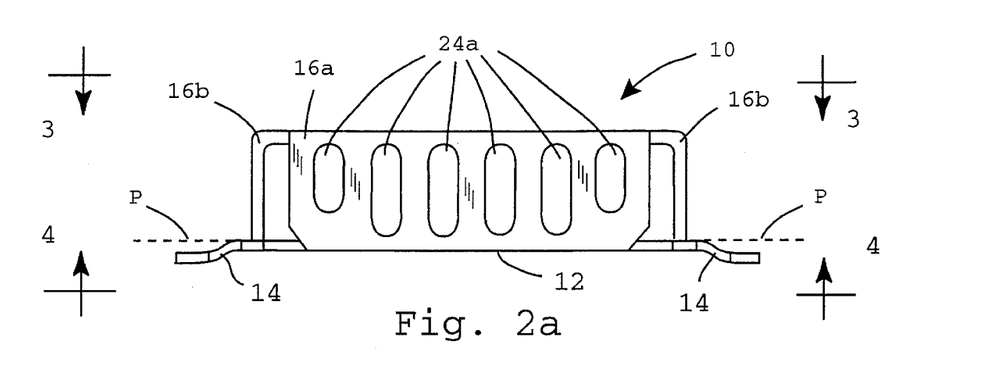
FIG. 2a is a side elevational view taken along line 2a—2a of FIG. 1.

In FIG. 2a the contact portion 12 of the unitary heat sink 10 defines a heat sink plane P parallel to its bottom surface. It is not necessary for the entire bottom portion of the heat sink 10 to be planar, but a sufficient portion of the bottom of the heat sink 10 should be planar to ensure good thermal contact with the top of an integrated circuit.

As mentioned previously, a number of legs 14 extend from the contact portion in a radial manner. In this preferred embodiment, four legs 14 are provided. In other embodiments, a smaller plurality of legs (e.g. two or three legs) may be used, although this tends to make the unitary heat sink 10 somewhat less stable. Each of the legs 14 are provided with a foot 20 having an aperture 22 for a purpose to be discussed subsequently.

The heat dissipation portion 15 is somewhat arbitrary in design. The purpose of the heat dissipation portion 15 is to provide a thermally conductive material which extends away from the integrated circuit and which provides a large surface area for heat dissipation. As well known to those skilled in the art, heat dissipation can occur through a number of thermodynamic mechanisms including radiation, convection, and conduction. In the present invention, heat dissipation from the portion 15 primarily occurs through convection and radiation.

As seen in FIGS. 1 and 2a, the heat dissipation portion 15 is formed into four fins two of which are labeled 16a and two of which are labeled 16b. Fins 16a are substantially straight, vertical fins and are provided with a number of convection slots 24a. These fins 16a rise from opposing sides of the unitary heat sink 10. Fins 16b have vertical portions of about the same height as fins 16a, but also have horizontal portions which extend inwardly relative to the heat sink 10 to provide additional surface area. The fins 16b are provided with a number of slots 24b and are formed along the remaining opposing edges of the heat sink 10. The overall configuration of the heat sink 10 is therefore that of a rectangular prism having the contact portion 12 as a base, the fins 16a and 16b as sides, and the folded over, horizontal portions of fins 16b as the top. Extending from this rectangular prism in a somewhat radial manner are the four legs 14.

The slots 24a and 24b provided in the fins 16a and 16b, respectively, are somewhat arbitrary in configuration and placement. The purpose of the slots 24a are several fold: 1) they increase the effective surface area of the fins 16a and 16b, respectively, thereby aiding in the heat dissipation; 2) they permit convection currents to flow through the unitary heat sink 10, again increasing heat dissipation; and 3) they remove unnecessary thermal mass from the heat sink 10.

Figure 2B:
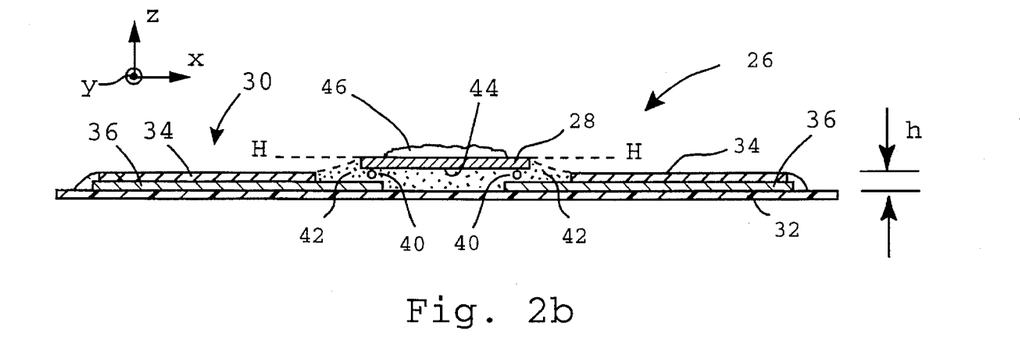

The unitary heat sink 10 of the present invention is well adopted for high performance packageless integrated structures. An example of a tape automated bonding (TAB) integrated circuit assembly is illustrated in FIG. 2b. The TAB assembly 26 includes an integrated circuit 28, a TAB interposer 30, and a printed circuit (P. C.) board 32. The TAB interposer 30 includes a insulation layer 34 (typically Kapton®) and conductive traces 36 (typically copper). The conductive traces 36 align with bonding ball bump 40 of integrated circuit 28. The bonding bump 40 fuses to make electrical contact between the traces 36 and the active components of IC 28 to thereby couple the integrated circuit 28 to other components on the printed circuit board 32 by techniques well known to those skilled in the art. An encapsulant 42 is provided over the assembly to seal the active (bottom) surface 44 of the IC 28 from the ambient environment. In accordance with the present invention, a thermal grease or adhesive 46 can be provided on top of the IC 28 (i.e. on the non-active or back side of the IC 28 die).

It should be noted that the TAB structure 26 of FIG. 2b is rather delicate. For example, a transverse force (e.g. a force in the x-y plane) can easily damage the IC die 28 or dislodge the ball bump 40. The assembly 26 is also somewhat delicate to forces in the z direction, but not quite so much as in the x-y plane direction.

Referring now to FIG. 2a and 2b, the unitary heat sink 10 is disposed over the IC die 28 such that contact portion 12 is in contact with the thermal grease 44 and/or the top of the IC 28. The top of the IC 28 therefore forms a substantially planar heat transfer surface H which is preferably parallel to the heat sink plane P. This ensures a good thermal coupling between the unitary heat sink 10 and the IC 28 and reduces the chance of damaging the IC 28 due to unevenly applied forces.

As will be discussed in greater detail subsequently, when the legs 14 are firmly attached to the PC board 32, the heat sink 10 is substantially inhibited from moving in the x-y plane. However, due to the resiliency of the legs 14, the heat sink 10 does provide a downward force in the negative z direction. This force should be large enough to ensure good thermal coupling between the integrated circuit 28 and the heat sink 10, but should not be so great as to cause any damage to the integrated circuit 28 or any portion surrounding the integrated circuit 28. It is therefore important that the legs 14 provide resiliency in the correct range such that the two aforementioned criteria are met.

Due to the fact that the legs 14 are resilient, various heights h of the TAB or other assembly can be accommodated by a single heat sink 10 design. For example, if larger die sizes are used, and the height h is increased, there is sufficient resiliency in the legs 14 to allow them to bend a bit further so that this increased height h is accommodated. Alternatively, if the thermal grease 46 is omitted, or if less encapsulant 42 is used, the height h will be less, and the heat sink 10 will accommodate by bending somewhat less.

In consequence, a unitary heat sink 10 is provided where the heat sink is substantially fixed relative to movement in the x-y plane, but is compliant in a z direction perpendicular to the x-y plane to accommodate integrated circuits of varying heights. Since, in this preferred embodiment, the contact portion 12 is much larger than the area of the IC die 28, IC dies of various sizes can be easily accommodated with a single heat sink 10. In consequence, a single, inexpensive heat sink 10 can be used as a heat sink for a number of different die sizes, IC package sizes, interconnection technologies, etc. to provide an effective, yet cost effective cooling of an electronic apparatus.

Figure 3:
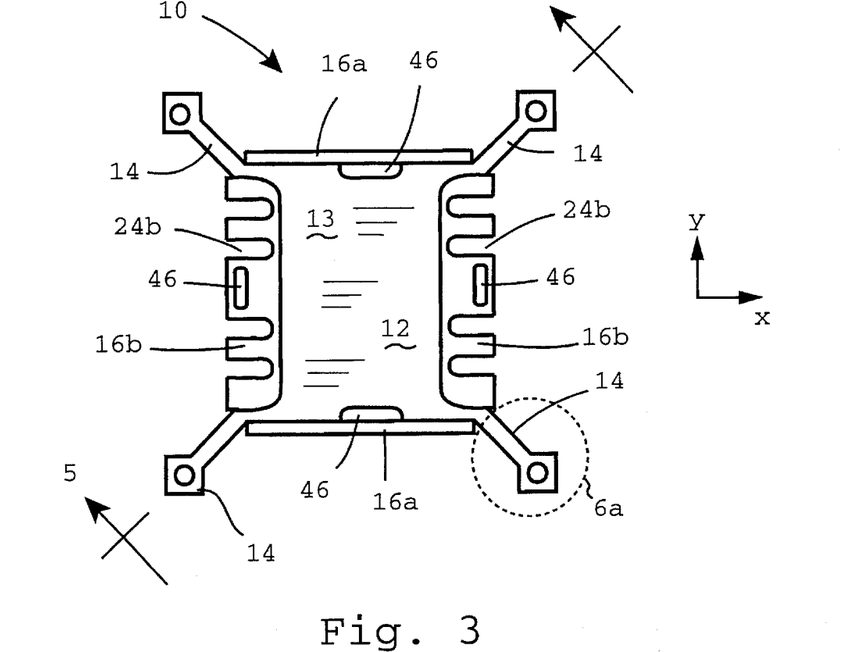
Figure 4:
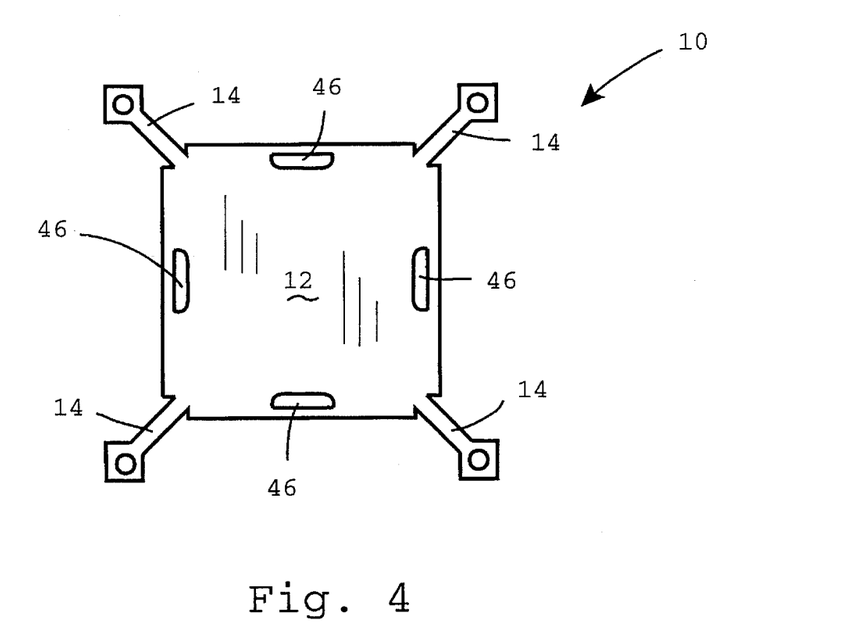

In FIGS. 3 and 4, a top plan view and a bottom plan view, respectively, taken along view lines 3 and 4 of FIG. 2a are shown. In these views, the contact portion 12 can clearly be seen to be a substantially square area, and is provided with a number of view slots 46. These view slots are used to allow observation of date code, lot number or any other device markings below the heat sink 10. It should be noted that the contact portion 12 is substantially parallel to the x-y plane. It should also be noted that while the contact portion 12 is shown to be entirely planar in this embodiment, in other embodiments only the portion of the contact portion 12 which contacts the integrated circuit die needs to be planar and parallel to the x-y plane.

Figure 5:
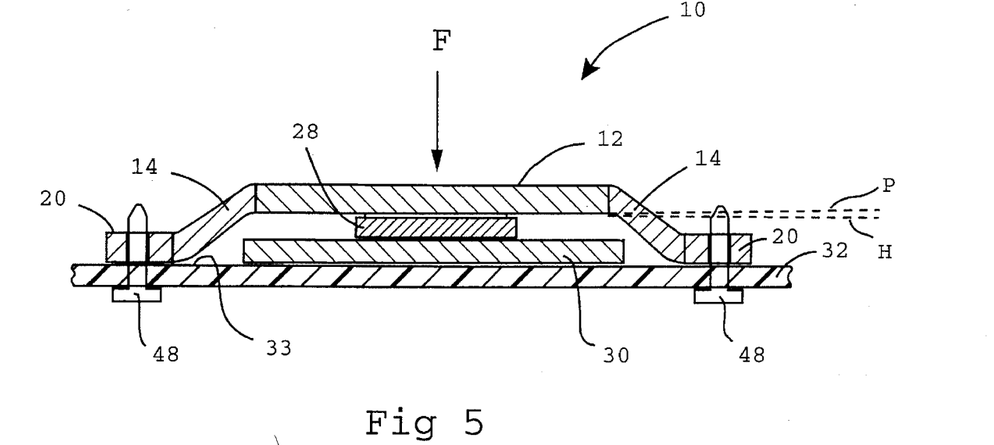
FIG. 5 is a cross-sectional view of a heat sink of the present invention installed on a PC board over an IC.

FIG. 5 is a cross-sectional view taken along line FIG. 5—5 after the heat sink 10 has been attached to the printed circuit board 32. It should be noted that the TAB interposer 30 has been replaced by a simple, conceptual layer for discussion purposes. The feet 20 are attached to the printed circuit board 32 by fasteners such as sheet metal screws 48. The act of fastening the feet 20 to the PC board 32 causes the legs 14 to bend and creates a spring force F against the IC 28. The higher the heat transfer plane H is from the surface of the PC board 32, the greater the force F will be against the IC 28 for a given leg configuration up to the point where plastic deformation of the leg begins. Conversely, if the heat transfer plane H is closer to the top surface 33 of the PC board 32, the spring force F will be less. Therefore, while the heat sink 10 can be used for a variety of different IC 20 heights, it does have an effective limit in that if the heat transfer plane H is too high from the top surface 33 of the PC board 32, too much force F will be applied to the IC 28, thereby damaging it. Similarly, if the heat transfer plane H is too close to the top surface 33, the force F will be insufficient to provide good thermal coupling between the contact portion 12 and the integrated circuit 28.

Figure 6A:
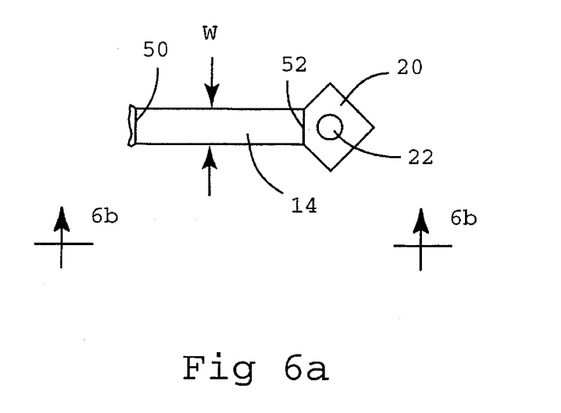
Figure 6B:
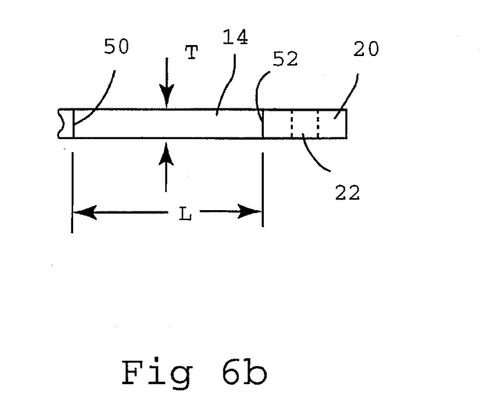

It will be apparent from the aforementioned discussions that the configurations of the legs 14 are important in providing the right amount of resiliency, and therefore the right amount of spring force F to be applied to the IC 28. In FIGS. 6a and 6b, a preferred leg design is illustrated. As noted in FIG. 5, when the leg 14 is attached to the PC board 32, the foot 20 becomes substantially parallel to the surface 33 of the PC board. This means that a majority of the spring action occurs between a knee 50 and an ankle 52 of the leg 14. The width of the leg 14 is given by W, its length between knee 50 and ankle 52 is given by L, and the thickness of the leg 14 is given by T. Since the right amount of resiliency is desired, there is a relationship between T, W, and L which will provide the desired spring force F against the integrated circuit 28 for a given height h. More particularly, there is a relationship between the length L and the cross-sectional area TW that has been found to be desirable. For the aforementioned aluminum alloy having a thickness of 1.6 mm, it has been found that a width of W of about 3.4 mm and a length L of about 10 mm will provide the desired force of about between 5 to 20 lbs with most TAB mounted IC's 28. It should be noted that in FIG. 6a and 6b, the legs 14 are illustrated in their undeformed configurations. As will be appreciated, a variety of configurations of the width W, the length L, and the thickness T will provide the desired force. For example, any configuration having a width W of at least 3 mm, a length L of at least 8 mm, and a thickness T of at least 1.5 mm would be suitable.

Figure 7:
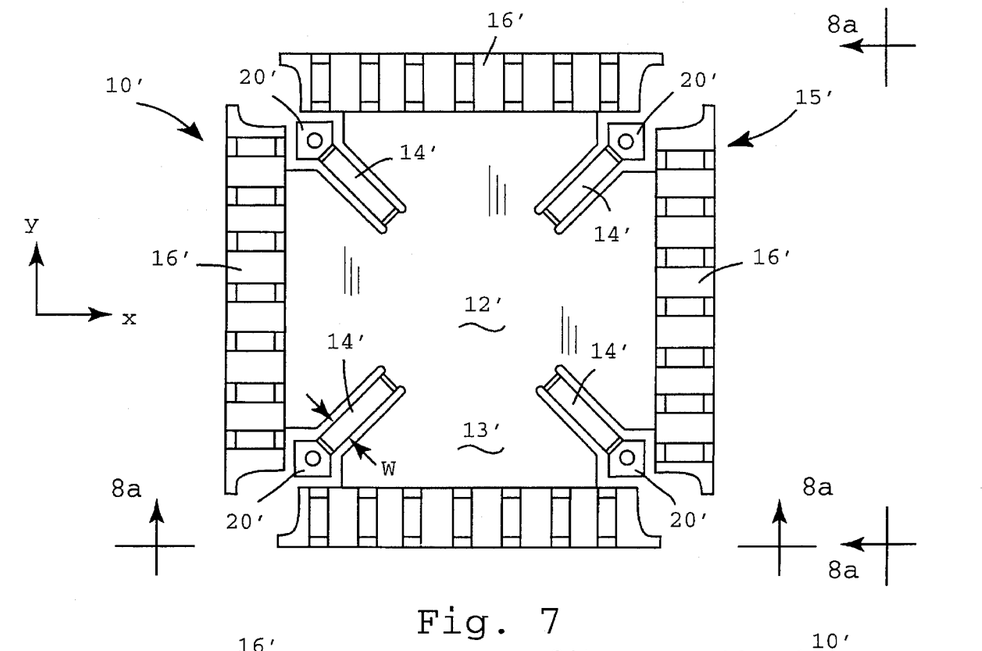
FIG. 7 is a top plan view of an alternate embodiment of a unitary heat sink of the present invention.

In FIG. 7, an alternate embodiment for unitary heat sink 10' is illustrated. In this alternate embodiment, the contact portion 12' is the central portion of the base of the heat sink 10' and the legs 14' are formed as part of a base 13'. However, it should still be noted that the legs 14' extend substantially radially outwardly from the contact portion 12' of the base 13'. The heat dissipation portion 15' is also larger than the heat dissipation portion of the prior embodiment and includes four u-shaped fins 16' of substantially identical construction. Each of the fins 16' are provided with slots 24' for purposes described previously.

The advantage of the embodiment of FIG. 7 is that the unitary heat sink 10' can dissipate considerably more heat than the unitary heat sink 10 of FIG. 1. This is due to several factors. For one, there is more material provided in heat sink 10' than in heat sink 10. This extra material helps the heat sink 10' to conduct heat away from the IC 28. For another, the fins 16' have much more surface area than the fins 16a or 16b of the heat sink 10. As such, a 40 mm×40 mm heat sink 10 of approximately 12 mm height will dissipate in the order of 3 watts, while a 60 mm×60 mm heat sink 10' of a height 27 will dissipate approximately 12 watts.

Figure 8A:
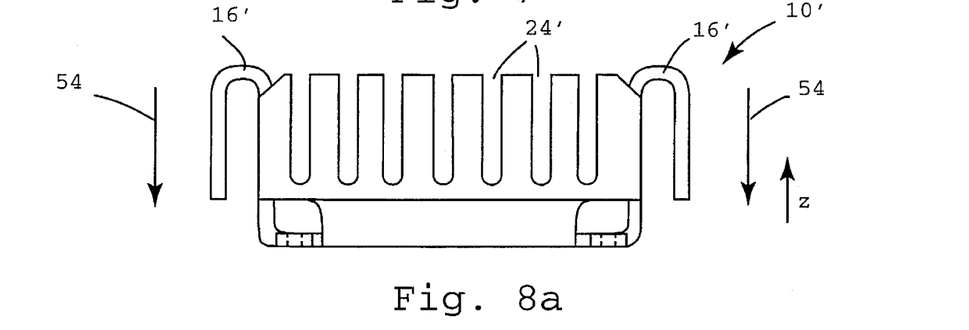
FIG. 8a is a side elevational view taken along line 8a—8a of FIG. 7.
Figure 8B:
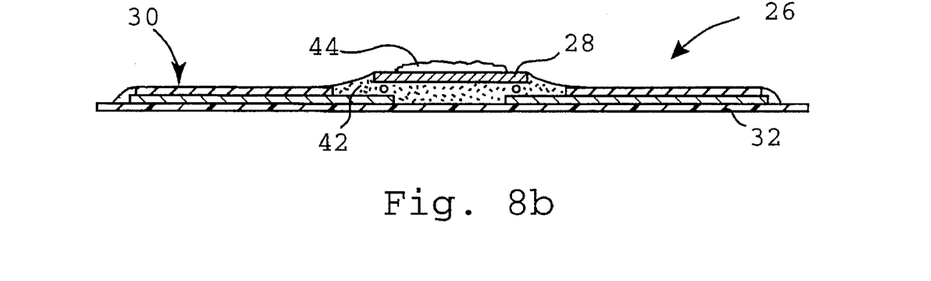

The heat sink 10' is attached over a TAB assembly 26 or the like in a fashion completely analogous to that described previously. In FIG. 8b, a TAB assembly 26 is aligned with a unitary heat sink 10' of FIG. 8a which is disposed over the integrated circuit IC as indicated by the direction arrows 54. The feet 20' of the legs 14' are attached to the PC board 32 with suitable fasteners (not shown). As before, the resilient legs 14 inhibit motion in an x-y plane, but allow compliance in a z direction to accommodate assemblies 26 of varying heights.

Figure 9:
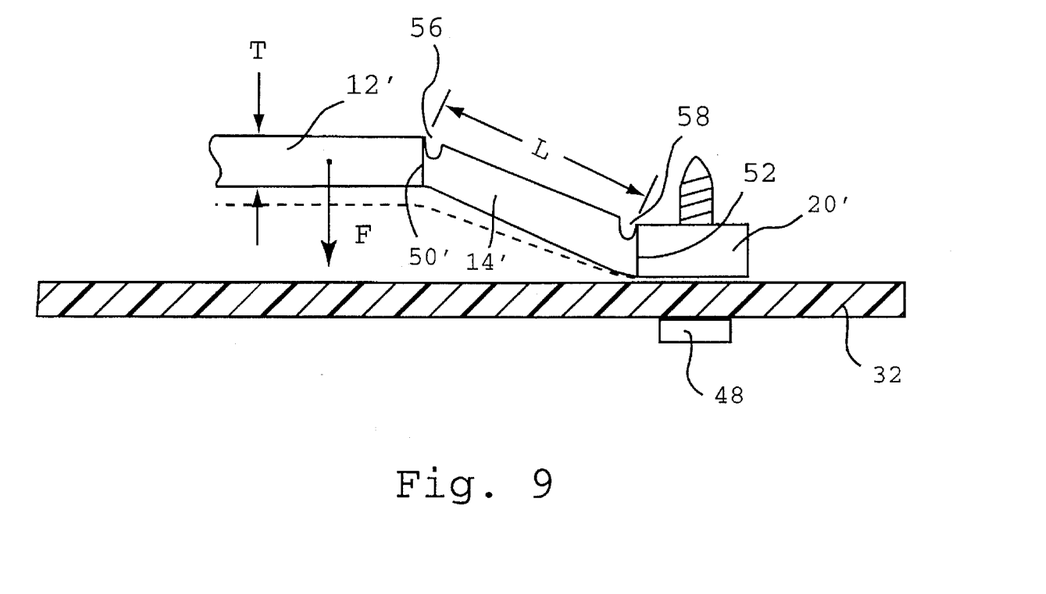
FIG. 9 is side elevational view of a leg of a unitary heat sink that is provided with a pair of live hinges.

In the detailed view of FIG. 9, a leg 14' having a foot 20' is shown attached to the PC board 32 with a fastener 48. The thickness T of the leg 14' is the same as the thickness T of the contact portion 12' and its length is given by L. The width of the leg 14' (as seen in FIG. 7) is W. Since the heat sink 10' made of slightly thicker material (making T larger), a pair of live hinges 56 and 58 are provided. As used herein, a "live hinge" is a place where material is thinner such that adjacent sections can "hinge" i.e. bend more easily. The live hinge 58 is adjacent to the knee 50' of leg 14' while the live hinge 58 is adjacent to the ankle 52 of leg 14'.

In the present embodiment, the live hinges 56 and 58 are formed by a stamping process and are typically about 1.1 mm deep. By making the length L of leg 14' about 10 mm, the width W about 4 mm, and having a thickness T of 2.2 mm, a spring force F of between 1 and 15 lbs is exerted against the heat transfer surface of the IC 28. As shown in broken lines, if the IC assembly was removed, the natural resiliency of legs 14' would cause the contact portion 12' to move somewhat towards the PC board 32.

Figure 10:
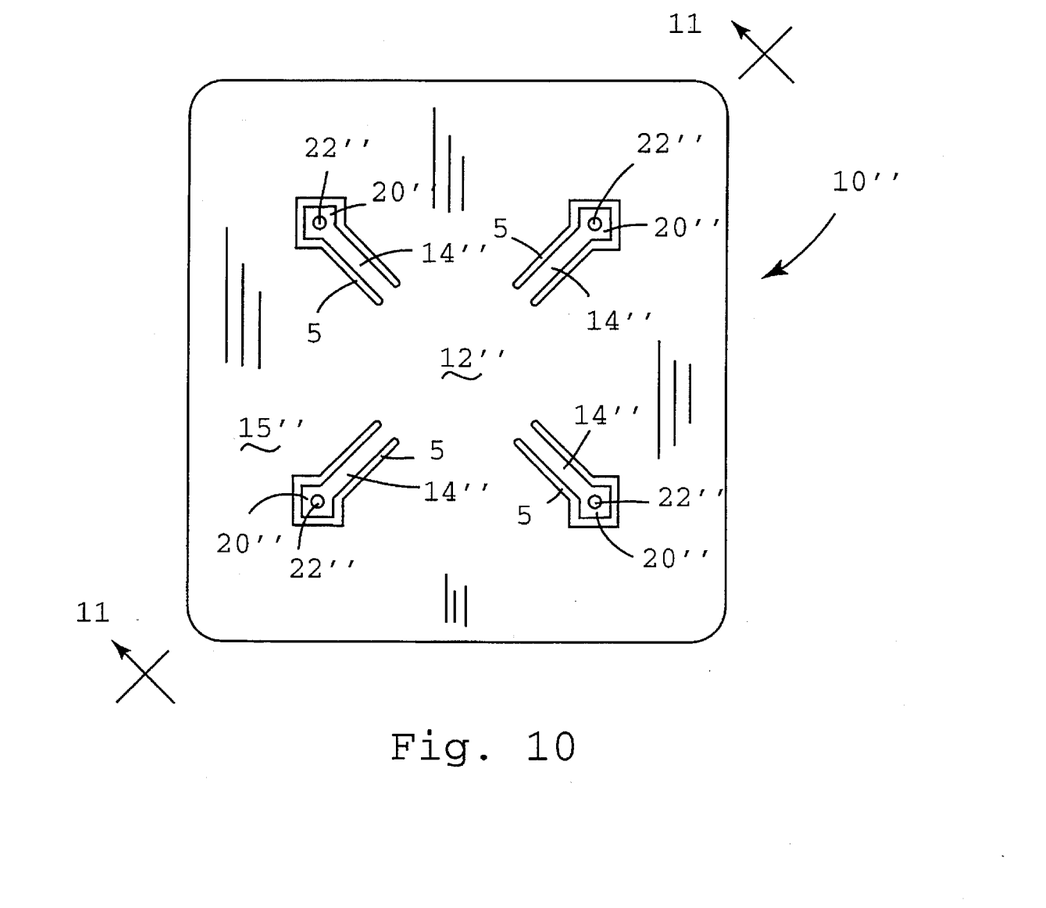
FIG. 10 is a top plan view of a second alternate embodiment of a unitary heat sink of the present invention.
Figure 11:
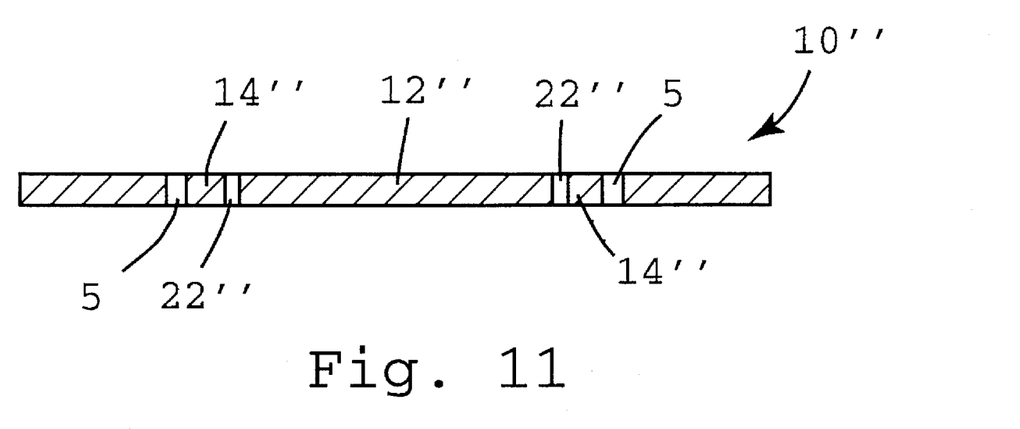
FIG. 11 is a cross-sectional view taken along line 11—11 of FIG. 10.

In FIG. 10, another alternate embodiment 10" for unitary heat sink of the present invention is disclosed. In this embodiment, a planar contact portion 12" is associated with four legs 14" extending substantially radially outwardly therefrom. The heat dissipation portion 15 is substantially co-planar with the contact portion 12". This planar heat sink 10" can comprise a section of a chassis wall or can be a separate piece of material, as shown. With additional reference to FIG. 11, the legs 14' are formed by stamping slots S from a sheet metal piece. Also stamped, are the holes 22" in the feet 20" of the legs 14".

There are several advantages of the unitary heat sink 10" of FIG. 10 in comparison with the previously described embodiments. First, if the heat sink 10" is formed as a portion of a chassis, no additional material is required to provide a heat sink. Second, a single punching operation can be used to provide the unitary heat sink 10", and no bending operations are required. The unitary heat sink 10" is therefore extremely economical to manufacture and, as will be discussed subsequently, has many of the advantages of the previous embodiments. However, heat sink 10" is neither as compact or as thermally efficient as the previously described embodiments.

Figure 12:
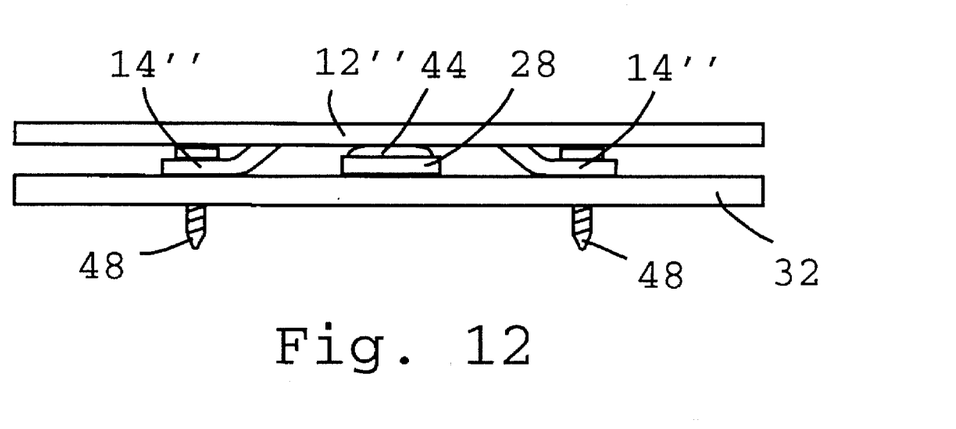
FIG. 12 is a side elevational view of the unitary heat sink of FIG. 10 attached to a printed circuit board.

In FIG. 12, a unitary heat sink 12" is attached to a printed circuit board 32. An IC 28 is thermally coupled to the contact portion 12" by a thermal grease 44. Alternatively, the thermal grease 44 can be omitted and the contact portion 12" can be in direct contact with the upper surface of the IC 28 to provide the thermal coupling. The legs 14" are attached to the PC board 32 by sheet metal screws 48.

As it will be appreciated from the foregoing discussion, a method for dissipating heat from an integrated circuit in accordance with the present invention includes the steps of: a) forming a unitary heat sink from a heat sink material; b) attaching an integrated circuit having a substantially planar heat transfer surface to a printed circuit board; and c) attaching leg portions of the heat sink to the printed circuit board such that a contact portion of the heat sink is in thermal communication with a heat transfer surface of the integrated circuit. The heat sink includes a contact portion defining the heat sink plane, and a number of integral spring leg portions formed contiguously with and cantilevered from the contact portions such that each leg portion has a distal end. The distal ends of the leg portions are attached to the printed circuit board (preferably with screws or bolts) to bend the leg portions from the heat sink plane such that a controlled spring force in the range of 5 to 16 lbs is provided against the heat transfer surface of the integrated circuit by the heat sink. Pressure less than 2 lbs are believed to be insufficient to provide a good thermal coupling between the IC and the heat sink for average sized dies of 1 cm square, and pressures greater than 20 lbs may break the IC or damage its connections.

Preferably, the method includes providing a thermal grease between the integrated circuit and the heat sink. A suitable thermal grease is provided by Thermoset Plastics, Inc. of Indianapolis, Ind. The thermal grease can decrease the thermal resistance up to 50 to 75%. The method further provides inhibiting the heat sink from moving in an x-y plane defined by the heat transfer surface, but remaining compliant in a z direction perpendicular to the x-y plane.

While this invention has been described in terms of several preferred embodiments, there are alterations, permutations, and equivalents which fall within the scope of this invention. It should also be noted that there are may alternative ways of implementing both the process and apparatus of the present invention. It is therefore intended that the following appended claims be interpreted as including all such alterations, permutations, and equivalents as fall within the true spirit and scope of the present invention.

What is claimed is:

1. A unitary heat sink comprising:
   a contact portion defining a heat sink plane and constructed from a heat sink material having a thermal conductivity at least 150 W/m°K., and
   a plurality of leg portions formed contiguously with and cantilevered from said contact portion such that each leg portion has a distal end, said leg portions comprising said heat sink material and having a sufficient resiliency such that deformations of said leg portions from said contact portion by positioning said distal ends of said leg portions out of said heat sink plane, provides a controlled spring force in the range of 5 to 16 lbs relative to said heat sink plane and towards said distal ends.

2. A unitary heat sink as recited in claim 1 wherein said heat sink material comprises aluminum and has a thermal conductivity of at least 221 watts per meter Degree Kelvin (w/m°K.).

3. A unitary heat sink as recited in claim 1 wherein said heat sink material comprises copper and has a thermal conductivity of at least 385 watts per meter Degree Kelvin (w/m°K.).

4. A unitary heat sink as recited in claim 1 wherein said heat sink material is selected from the group of materials consisting essentially of aluminum, aluminum alloys, copper, and copper alloys.

5. A unitary heat sink as recited in claim 1 wherein a thermally conductive material is applied to a surface of said heat sink material to enhance heat transfer with said heat sink material.

6. A unitary heat sink as recited in claim 5 wherein said thermally conductive material comprises a thermal grease.

7. A unitary heat sink as recited in claim 1 further comprising a heat dissipation portion formed contiguously with said contact portion and formed of said heat sink material.

8. A unitary heat sink as recited in claim 7 wherein said heat dissipation portion comprises at least one fin.

9. A unitary heat sink as recited in claim 8 wherein said fin is provided with at least one aperture to promote heat dissipation.

10. A unitary heat sink as recited in claim 1 wherein each of said leg portions include a proximate end formed contiguously with said contact portion and wherein said distal end is formed into a foot.

11. A unitary heat sink as recited in claim 10 wherein each foot of each leg portion lies within a common plane that is substantially parallel to said heat sink plane.

12. A unitary heat sink as recited in claim 11 wherein each foot of each leg portion is provided with an aperture receptive to a fastener.

13. A unitary heat sink as recited in claim 10 wherein a central section of each of said leg portions have about the same lengths and cross sectional areas.

14. A unitary heat sink as recited in claim 13 wherein said lengths are at least 8 mm and said cross sectional areas are at least 1.5 mm by 3 mm.

15. A unitary heat sink as recited in claim 10 wherein each leg portion is provided such that a given leg portion has a corresponding live foot hinge between its foot and a central section of said given leg portion.

16. A unitary heat sink as recited in claim 15 wherein said given leg portion is provided with a corresponding live leg hinge provided at about said proximate end of said given leg portion.

17. A unitary heat sink as recited in claim 13 wherein each toot has a greater cross-sectional area than an associated central section.

18. A unitary heat sink as recited in claim 4 wherein said plurality of leg portions include at least two leg portions radiating outwardly from said contact portion.

19. A unitary heat sink as recited in claim 18 wherein said plurality of leg portions consist of four leg portions substantially equally spaced around said contact portion.

20. An electronic apparatus with a unitary heat sink comprising:
   a printed circuit board;
   an integrated circuit coupled to said printed circuit board and having a substantially planar heat transfer surface;
   a unitary heat sink thermally coupled with said integrated circuit and thereby operative to dissipate heat generated by said integrated circuit during the operation of said electronic apparatus, said unitary heat sink including:
   (a) a contact portion defining a heat sink plane and constructed from a heat sink material which is thermally coupled to said integrated circuit; and
   (b) a plurality of leg portions formed contiguously with and cantilevered from said contact portion such that each leg portion has a distal end; and
   a plurality of fasteners attaching said distal ends of said leg portions to said integrated circuit such that said leg portions provide a spring force in the range of 5 to 16 lbs against said heat transfer surface of said integrated circuit.

21. An electronic apparatus as recited in claim 20 wherein said heat sink material is selected from the group of materials consisting essentially of aluminum, aluminum alloys, copper, and copper alloys.

22. An electronic apparatus as recited in claim 20 further comprising a thermally conductive material applied between said heat transfer surface of said integrated circuit and said contact portion of said unitary heat sink to enhance heat transfer from said integrated circuit to said heat sink.

23. An electronic apparatus as recited in claim 20 wherein said integrated circuit is selected from the group consisting essentially of Direct Chip Attach (DCA) integrated circuits, Tape Automated Bonding (TAB) integrated circuits, and Ball Grid Array (BGA) integrated circuits.

24. An electronic apparatus as recited in claim 20 wherein said planar heat transfer surface defines an x-y plane, and wherein said unitary heat sink is substantially fixed relative to movement in said x-y plane but is compliant in a z direction perpendicular to said x-y plane.

25. An electronic apparatus as recited in claim 20 wherein said unitary heat sink further comprises a heat dissipation portion formed contiguously with said contact portion and formed of said heat sink material.

26. An electronic apparatus as recited in claim 25 wherein each of said leg portions include a proximate end formed contiguously with said contact portion and wherein said distal end is formed into a foot.

27. An electronic apparatus as recited in claim 26 wherein each foot of each leg portion lies within a common plane that is substantially parallel to said heat sink plane.

28. An electronic apparatus as recited in claim 27 wherein each foot of each leg portion is provided with an aperture receptive to at least one of said fasteners.

29. An electronic apparatus as recited in claim 28 wherein each of said leg portions is provided with a live foot hinge between said foot and an associated central section of each leg portion.

30. An electronic apparatus as recited in claim 29 wherein each of said leg portions is provided with a live leg hinge provided at about said proximate ends of said leg portions.

31. A method for dissipating heat from an integrated circuit comprising the steps of:

(a) forming a unitary heat sink from a heat sink material, said heat sink including a contact portion defining a heat sink plane, and a plurality of integral, spring leg portions formed contiguously with and cantilevered from said contact portion such that each leg portion has a distal end;

(b) attaching an integrated circuit having a substantially planar heat transfer surface to a printed circuit board such that said heat transfer surface faces away from said printed circuit board; and (c) attaching said leg portions of said heat sink to said printed circuit board such that said contact portion of said heat sink is in thermal communication with said heat transfer surface and such that a spring force in the range of 0 to 15 lbs is provided against said heat transfer surface by said heat sink.

32. A method for dissipating heat from an integrated circuit as recited in claim 31 further comprising the step of providing a thermal transfer material between said contact portion of said heat sink and said heat transfer surface to provide thermal communication.

33. A method for dissipating heat from an integrated circuit as recited in claim 31 wherein said step of attaching leg portions of said heat sink to said printed circuit board causes a deformation in said legs.

34. A method for dissipating heat from an integrated circuit as recited in claim 31 wherein said heat sink is inhibited from movement along an x-y plane defined by said heat transfer surface but is compliant in a z direction perpendicular to said x-y plane.

* * * * *

UNITED STATES PATENT AND TRADEMARK OFFICE
CERTIFICATE OF CORRECTION

PATENT NO. : 5,504,652
DATED : Apr. 2, 1996
INVENTOR(S) : Foster et al.

It is certified that error appears in the above-indentified patent and that said Letters Patent is hereby corrected as shown below:

Column 3, line 5, change "the/bur" to --the four--

Column 4, line 42, change "(W/m°K)" to --(W/m°K.)--

Column 10, line 10, change "toot" to --foot--

Signed and Sealed this

Twenty-fifth Day of February, 1997

Attest:

BRUCE LEHMAN

*Attesting Officer*   *Commissioner of Patents and Trademarks*